(12) United States Patent      (10) Patent No.: US 8,156,892 B2
Hardikar et al.      (45) Date of Patent: Apr. 17, 2012

(54) EDGE PROFILING FOR PROCESS CHAMBER SHIELDS

(75) Inventors: Kedar Hardikar, San Jose, CA (US); Yajie Liu, San Jose, CA (US); Viraj Pandit, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 1003 days.

(21) Appl. No.: 12/123,207

(22) Filed: May 19, 2008

(65) Prior Publication Data

US 2009/0283037 A1    Nov. 19, 2009

(51) Int. Cl.
    *B05C 11/11*      (2006.01)
    *C23C 16/00*      (2006.01)

(52) U.S. Cl. ........................................ 118/504; 118/715

(58) Field of Classification Search .................. 118/504, 118/715
See application file for complete search history.

(56) References Cited

U.S. PATENT DOCUMENTS

| | | | | |
|---|---|---|---|---|
| 5,108,570 | A | * | 4/1992 | Wang .......................... 204/192.3 |
| 5,518,593 | A | | 5/1996 | Hosokawa et al. |
| 5,589,224 | A | * | 12/1996 | Tepman et al. ............ 427/248.1 |
| 5,632,873 | A | * | 5/1997 | Stevens et al. ........... 204/298.15 |
| 5,803,977 | A | * | 9/1998 | Tepman et al. ............... 118/728 |
| 6,051,122 | A | | 4/2000 | Flanigan |
| 6,171,453 | B1 | * | 1/2001 | Chung et al. ............. 204/192.12 |
| 6,231,725 | B1 | * | 5/2001 | Nulman et al. .......... 204/192.12 |
| 6,533,868 | B1 | * | 3/2003 | Green et al. ................... 118/720 |
| 6,627,050 | B2 | * | 9/2003 | Miller et al. ............. 204/192.22 |
| 7,041,200 | B2 | | 5/2006 | Le et al. |
| 2009/0283037 | A1 | * | 11/2009 | Hardikar et al. .............. 118/504 |

OTHER PUBLICATIONS

U.S. Appl. No. 10/823,355, filed Apr. 12, 2004, entitled "Moving Interleaved Sputter Chamber Shields".
"Delamination of Compressed Films on Curved Substrates", John W. Hutchinson, Journal of the Mechanics and Physics of Solids 49 (2001) pp. 1847-1864.
U.S. Appl. No. 12/200,721, "Textured foil shields for deposition process chambers", Kuo et al., filed Aug. 28, 2008.
U.S. Appl. No. 10/823,355, Office Action mailed May 7, 2007.
U.S. Appl. No. 10/823,355, Office Action mailed Jul. 25, 2007.
U.S. Appl. No. 10/823,355, Office Action mailed Nov. 30, 2009.
U.S. Appl. No. 10/823,355, Office Action mailed Feb. 18, 2010.
U.S. Appl. No. 10/823,355, Office Action mailed Aug. 31, 2010.
U.S. Appl. No. 10/823,355, Office Action mailed Feb. 16, 2011.
KR patent application No. 20-2008-0015408, Notice of Provisional Rejection mailed Oct. 14, 2010.
KR patent application No. 20-2008-0015408, Notice of Decision to Grant mailed Jun. 21, 2011.
U.S. Appl. No. 10/823,355, Office Action mailed Jul. 20, 2011.

* cited by examiner

*Primary Examiner* — Sylvia R. MacArthur
(74) *Attorney, Agent, or Firm* — Weaver Austin Villeneuve & Sampson LLP

(57) ABSTRACT

Process chamber shields having specially profiled edges exhibit increased lifetime in PVD and CVD deposition chambers. Edge profiling reduces flaking and delamination of materials deposited onto the shields, thereby prolonging shield life, and, consequently, reducing costs associated with deposition. In one embodiment, a shield having an edge portion terminating in a rounded tip, where the tip has high curvature and a small thickness, is provided. In another aspect, a shield having a concave portion connecting with an edge portion, where an upper (inner) surface of the edge portion forms a tangent plane to the upper (inner) concave surface of the concave surface, is provided. In yet another aspect, a shield with a tapered edge portion is provided. Shields, having profiled edges in accordance with these aspects, and in accordance with combinations of these aspects, can better support deposited films, particularly films containing compressively stressed materials, such as metal nitrides.

25 Claims, 5 Drawing Sheets

EDGE PROFILING FOR PROCESS CHAMBER SHIELDS

FIELD OF THE INVENTION

This invention relates to shields used in vacuum process chambers to protect chamber walls from unwanted deposition of material. Specifically, this invention relates to improving edge profile of process chamber shields, particularly of physical vapor deposition (PVD) chamber shields.

BACKGROUND OF THE INVENTION

Fabrication of integrated circuits (IC) typically involves one or more steps performed in vacuum process chambers, where material processing (e.g., deposition and/or etching) is performed at subatmospheric pressure. For example, many metals and metal nitrides are deposited onto a wafer substrate by sputtering in a PVD process chamber, usually in a plasma-assisted iPVD process. Many dielectric materials are deposited in a chemical vapor deposition (CVD) process chamber, e.g., in a plasma enhanced chemical vapor deposition (PECVD) chamber, high density plasma chemical vapor deposition (HDPCVD) chamber, low pressure chemical vapor deposition (LPCVD) chamber, and the like. Further, many etching processes are performed in vacuum process chambers, e.g., in chambers adapted for plasma etching and reactive chemical etching.

During deposition and/or etching, the components of the chamber, such as chamber walls, sides of wafer pedestal, and wafer chuck are protected from unwanted deposition of material by a shielding system which includes one or more shields configured to accept the unwanted flux (over-spray) of the deposited material. As a result, little or no deposition occurs on protected surfaces of the chamber, while a layer of material builds up on the shields.

Process chamber shields often have generally cylindrical shapes or other shapes that generally follow the geometry of protected surfaces. The shields are typically mounted to a chamber element (e.g., chamber wall, or wafer pedestal) at one end, and have a distal end freely terminating within the interior space of a process chamber. In addition to a general shape, the shields may have a variety of locally shaped portions, e.g., concave portions, convex portions, S-shaped portions, etc., which are used to optimize chamber surface protection. In some embodiments, generally flat shields may be employed.

Process chamber shields can be used for a certain amount of time without cleaning or replacement. Typically, the shields are used until the layer of material deposited on their surface becomes too thick to be supported by the shield and begins to flake or delaminate thereby leading to contamination. Periodic preventive maintenance requirement (PM) also limits the time over which shields can be used continuously. Flaking may lead to substrate contamination resulting from undesired release of loose particles on the substrate. Shortly before substantial flaking starts to occur, the shield is typically replaced with a new shield or is cleaned to remove the layer of deposited material, and is then re-installed into the process chamber.

Shields, particularly shields having complex shapes, are often expensive. Further, re-installation of a shield system in a deposition chamber can also be a costly procedure. Accordingly, it is highly desirable to provide shielding systems with increased lifetime to minimize costs of IC fabrication. Specifically, it is desirable to provide shields which would be able to support thicker films on their surfaces without film flaking or delamination.

SUMMARY

Process chamber shields having specially profiled edges can increase shield lifetime within a process chamber. The shields can be used in a variety of process chambers, adapted for deposition and/or etching, e.g., they are particularly well suited for use in vacuum process chambers, such as in PVD and CVD process chambers. Edge profiling reduces flaking and delamination of materials deposited onto the shields, thereby prolonging shield life, and, consequently, reducing costs associated with material processing (deposition and/or etch). In one embodiment, a shield having an edge portion terminating in a rounded tip, where the tip has high curvature and a small thickness, is provided. In another aspect, a shield having a concave portion connecting with an edge portion, where an upper (inner) surface of the edge portion forms a tangent plane to the upper (inner) concave surface of the concave portion, is provided. In yet another aspect, a shield with a tapered edge portion is provided. Shields, having profiled edges in accordance with these aspects and in accordance with combinations of these aspects, can better support deposited films, particularly films containing compressively stressed materials, such as metal nitrides.

The term "shields" as used herein refers to elements of a process chamber, adapted to protect chamber components from undesired deposition of material. The shields can be movable or stationary, and can be used to protect chamber walls, wafer pedestal, wafer chuck, and other chamber components from unwanted material deposition. For example the shields, as used herein, will include a shutter, adapted to protect the wafer chuck. The terms "connecting" and "connected" as used herein encompass both a continuous connection (e.g., a continuous shield, where an edge portion continues a main portion), and a connection between different segments (e.g., a shield where an edge portion is welded to or is otherwise attached to a main shield portion.

According to one aspect, a shield configured for protecting components of a vacuum process chamber from undesired deposition of a material includes: (a) a main portion designed or adapted to connect to an element of the vacuum process chamber (e.g., a chamber wall, a pedestal, or an electrostatic chuck), the main portion comprising an upper main surface and a lower main surface, wherein the main portion has a first average thickness; (b) a generally perimetrically shaped edge portion connected with the main portion, wherein the edge portion has an upper edge surface connected with the upper main surface and a lower edge surface connected with the lower main surface, wherein the edge portion has a second average thickness; and (c) a tip portion forming the terminus of the edge portion within an interior space of the chamber, and connecting the upper edge surface and a lower edge surface, wherein the tip portion has a rounded profile, such that an arc-like shape connects the upper edge surface and the lower edge surface, and wherein the distance between the upper edge surface and the lower edge surface at the tip is less than the average thickness of the main portion of the shield.

The terms "upper" and "lower" are used herein to distinguish different surfaces of the shield and do not necessarily define the relative position of these surfaces within the chamber.

In some embodiments it is preferable to minimize the shield thickness at the tip. Thus, in some embodiments, the distance between the upper edge surface and the lower edge surface at the tip (or thickness at the tip) is less than about 0.2 inches, e.g., less than about 0.1 inches, less than about 0.05 inches and even less than about 0.02 inches. The average thickness of the main portion of the shield is greater than the thickness at the tip, and is typically greater than about 0.2 inches.

The rounded tip, in one embodiment, has a radius of curvature that is equal to ½ of the shield thickness at the tip and a central angle of 180°. In other embodiments, the rounded tip may have a lower central angle, and a different radius of curvature.

In some embodiments the average thickness of the main portion of the shield is greater than the average thickness of the edge portion of the shield. In one embodiment, the edge portion is tapered such that thickness of the edge portion decreases from the interface with the main portion of the shield towards the tip.

In one embodiment, at least a part of the main portion of the shield has a generally concave shape, which has a concave upper surface, and where the upper surface of the edge portion of the shield forms a tangent plane to the concave upper surface of the main portion of the shield. Using a tangent plane at the edge ("edge flattening") rather than using a concave edge on a concave shield, improves the shield ability to support deposited films, and results in further increase in shield lifetime. The radius of curvature at the concave main portion can vary widely, e.g., ranging from between about 0.1 and about 10 inches. The length of the formed tangent at the edge (as viewed in cross-section) in some embodiments is between about 0.1 and 5 inches.

In a second aspect, a shield containing an improved edge profile connected with a concave shield portion is provided. The shield configured for protecting components of a vacuum process chamber from undesired deposition of a material, the shield includes (a) a concave portion comprising an upper concave surface and a lower surface, wherein the concave portion of the shield has a first average thickness; and (b) an edge portion connecting with the concave portion, wherein the edge portion has an upper edge surface connecting with the upper concave surface and a lower edge surface connecting with the lower surface of the concave portion, wherein the edge portion has a second average thickness, and wherein the upper surface of the edge portion of the shield forms a tangent plane to the concave upper surface of the concave portion of the shield. The shield provided by this aspect, can be used as a separate shield design or in combination with a shield design described above in the first aspect. For example, the shield may have a rounded tip, and a small thickness at the tip. In some embodiments, the average thickness of the edge portion is smaller than the average thickness of the concave portion.

In a third aspect, a shield containing an improved edge portion having a small thickness at the tip of the shield is provided. The shield configured for protecting components of a vacuum process chamber from undesired deposition of a material includes: (a) a main portion designed or adapted to connect to an element of the vacuum process chamber (e.g., a chamber wall, a pedestal, or an electrostatic chuck), the main portion comprising an upper main surface and a lower main surface, wherein the main portion has a first average thickness; (b) a generally perimetrically shaped edge portion connected with the main portion, wherein the edge portion has an upper edge surface connected with the upper main surface and a lower edge surface connected with the lower main surface, wherein the edge portion has a second average thickness; and (c) a tip portion forming the terminus of the edge portion within an interior space of the chamber, and connecting the upper edge surface and a lower edge surface, wherein the tip portion has a rounded profile, such that an arc-like shape connects the upper edge surface and the lower edge surface, and wherein the distance between the upper edge surface and the lower edge surface at the tip is less than about 0.2 inches (e.g., less than about 0.1 inches, less than about 0.05 inches, and even less than about 0.02 inches) The shield, provided by this aspect, can be used as a separate design, or as a combination with shield features described above. For example, the main portion of the shield may include a concave portion which has an upper concave surface, connecting with a tangent plane forming a flattened edge of the shield, as was described in the previous aspect.

According to another aspect, a process chamber containing a shield as any of the shields described above is provided. The process chamber may be a vacuum process chamber, such as a PVD, CVD or a plasma etching process chamber.

According to some embodiments the shields provided herein have a kit life of at least about 2,000 kW·Hour when used in a vacuum chamber.

In another aspect, a method of shielding a process chamber (e.g., a PVD or CVD process chamber) from undesired deposition of a material is provided, where the shielding method involves: (a) providing a wafer substrate and at least one shield as described above into a vacuum process chamber, wherein the shield is connected with a chamber component and (b) depositing the material onto the substrate and onto the shield or etching the material from the substrate while depositing the material onto the shield, such that material deposited onto the shield does not flake or does not contaminate the substrate.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as to not unnecessarily obscure aspects of the present invention.

Introduction and Overview

The invention relates to profiling of shield edges for extending shield lifetime in a process chamber. Specific shield edge shapes which can support thicker layers of materials with reduced material flaking and delamination are provided. Use of shields with profiled edges, as described herein, can increase shield lifetime and, consequently, reduce costs of IC fabrication.

The described shields can be used in a variety of process chambers where protection of chamber components, such as chamber walls, wafer chuck or a wafer pedestal, from unwanted material deposition is desired. The shields are well-suited to be used in vacuum deposition chambers, such as in PVD deposition chambers and CVD deposition chambers as well as in plasma and reactive etch chambers. For example, the described shields can be used in plasma PVD chambers (iPVD) chambers (including planar magnetron and hollow cathode magnetron (HCM) systems) to protect PVD chamber walls and wafer pedestal from over-spray material sputtered from a PVD target. While the shields will be now described in a context of a PVD chamber, as an illustration, the shields can be similarly employed in CVD chambers, including PECVD, LPCVD, HDPCVD, and atomic layer deposition (ALD) process chambers, and in etch chambers (e.g., pre-clean chambers).

Figure 1:
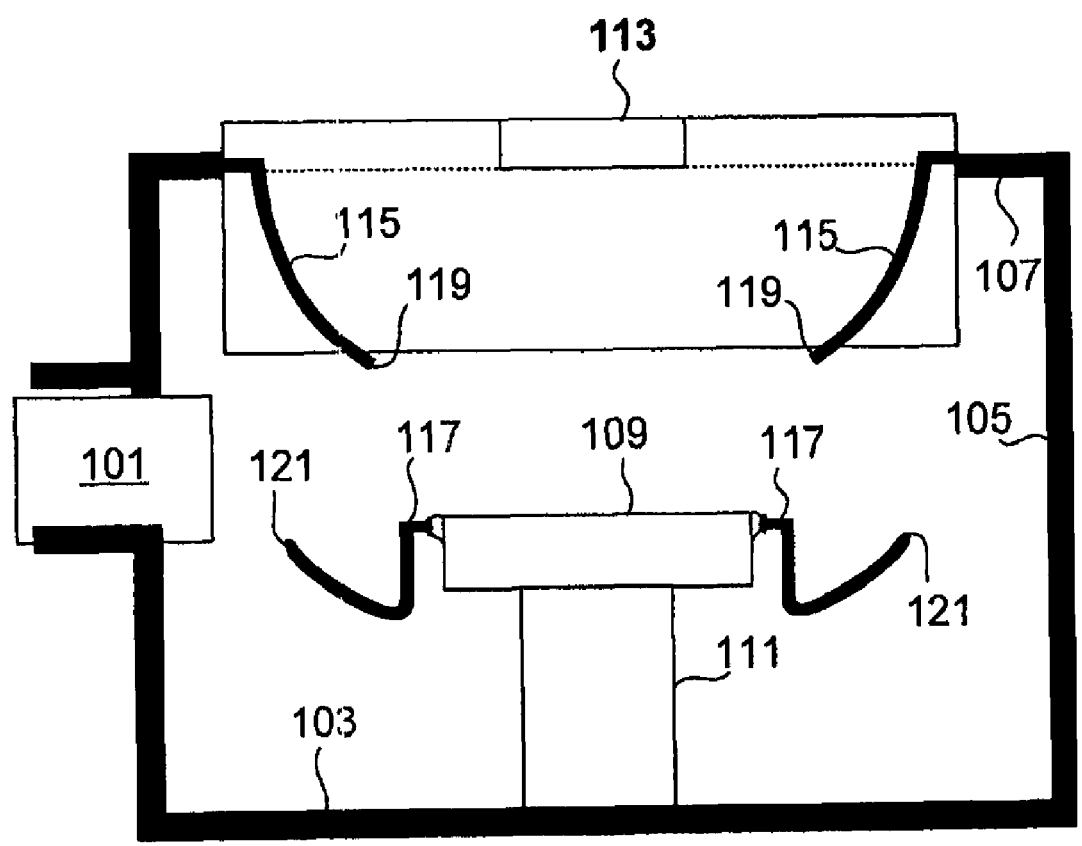
FIG. 1 is a side view, in cross-section, of a portion of a PVD chamber illustrating sidewall and pedestal shields.

A cross-sectional schematic view of a PVD chamber is illustrated in FIG. 1. The illustrated PVD chamber has a vacuum valve or gate system 101 which permits wafers to be loaded into and removed from the chamber interior. The chamber interior is bounded by a lower wall 103, sidewall 105 and upper wall 107, and defines a generally cylindrical interior volume. Wafer holder or pedestal 109 is secured to movable support 111 along the central axis of the chamber. The wafer pedestal can move between the loading and unloading position (shown in FIG. 1) and a processing position in which the wafer residing on a wafer pedestal is raised closer to the proximity of the sputter target 113 secured at the top interior portion of the chamber. Sidewall shield 115 and a pedestal shield 117 are provided within the chamber and are connected with the chamber walls 107 and with wafer pedestal 109, respectively, to prevent unwanted deposition of sputtered material from the sputter target to the side and lower walls of the deposition chamber.

The sidewall shield 115 extends substantially around and within the chamber sidewalls, and comprises a downwardly and inwardly extending portion, such that a concave arcuate shape is formed, as viewed from the target 113. The sidewall shield terminates with an edge portion 119 that is generally similar in shape to the chamber-wall profile and is generally perimetrical (e.g. circumferential in a cylindrically shaped chamber), ending in a tip extending within the space of a chamber.

The pedestal shield 117 extends substantially around to surround pedestal 109 and is movable therewith. The pedestal shield 117 comprises a concave arcuate portion (as viewed from the target 113) extending outwardly toward the chamber sidewalls 105, curving upward and terminating in upward and outward edge portion 121 which ends with a tip extending within the space of a chamber. The tip is distal to the portion of the shield that is mounted to the pedestal 109. The shields described herein may be made from any material typically used in deposition chamber shielding, for example stainless steel or aluminum. During substrate processing, the wafer pedestal is raised to the target such that shields 115 and 117 interleave and provide protection to the chamber sidewalls. Of course, the invention is not limited to a particular shield arrangement depicted in FIG. 1, and can be used in conjunction with a variety of shield arrangements, as will be easily understood by one of skill in the art. For example, wafer pedestal may be stationary in some PVD systems, and may not necessarily have a shield attached to it. Instead, a shield, residing on bottom chamber walls or mounted to chamber sidewalls may be used.

In an iPVD system, which is commonly used in modern IC fabrication, deposition occurs with the use of plasma. During deposition, plasma is ignited within the chamber, typically at a pressure of less than about 100 mTorr. The plasma contains inert gas ions (e.g., $Ar^+$), which impinge onto the negatively biased target, resulting in sputtering of a target material, which is deposited onto the wafer substrate and onto the shields. A number of materials may be deposited in a PVD chamber, including metals (e.g., Cu, Ti, Ta, W, Al and their various alloys) and metal nitrides (e.g., $TaN_x$, $TiN_x$, $WN_x$ and the like). Deposition of a metal nitride typically involves flowing a nitrogen source (e.g., $N_2$) into the deposition chamber, igniting the plasma, and sputtering metal from the target. The deposited metal is immediately nitrided under these conditions. Materials listed above will deposit both on the wafer substrate and on the shields.

Shield lifetime depends, among other factors, on the ability of the shield to accommodate the stress of the deposited film. It is particularly challenging to accommodate compressively stressed materials, which tend to easily flake and delaminate. Delamination of compressively stressed films is more strongly pronounced on convex surfaces of the shields. Therefore, it is advantageous in many embodiments to provide a concave surface with respect to the flux of the sputtered species. It can be seen in FIG. 1 that shields 115 and 117 include concave portions (as seen from the target), and thereby can accommodate relatively thick layers of deposited films, including films comprising compressively stressed materials, such as $TaN_x$, $TiN_x$, $WN_x$, Cu, Al, and the like. While it is desirable in many embodiments, to provide concave shields, it was observed that even with the use of concave shield shapes, delamination of the deposited film can occur rather readily on shield edges (e.g., on edges 119 and 121 shown in FIG. 1).

The terms "concave" and "convex", as used herein, refer to concave and convex surfaces with respect to flux of material deposited onto the shield. In many embodiments, this corresponds to concavity or convexity with respect to the PVD target.

Several edge profiles which can significantly improve shield lifetime by decreasing film flaking and delamination at the shield edge are provided. These profiles make use of complex interplay between shield strain and film stress to achieve a geometry that unexpectedly results in a shield life increase, as compared to a conventional shield design.

The use of described shields is particularly advantageous (but is in no way limited to) deposition processes which involve deposition of compressively stressed films, including both PVD and CVD-deposited conductive and dielectric compressively stressed films. However, the described shields may be used in conjunction with deposition of other types of materials, as well.

Shield Tip

According to one aspect, a shield with a specially engineered tip is provided. As it was mentioned, it is desirable in many embodiments to minimize or even entirely avoid convex surfaces on the shield. In some embodiments no more than 10% preferably no more than 1% of shield surface area in the deposition chamber is convex, where the surface refers to shield surface freely available to the depositing flux, e.g., surface available for line-of-sight deposition. However, even when convex surfaces are eliminated for most part, tip portions of shields will inevitably include some convex surfaces, since the tip is connecting the upper and lower surfaces of the shield edge. The terms "upper" and "lower" are used herein to differentiate between two surfaces of the shield, but do not necessarily define the position of these surfaces within the deposition chamber. However, as used herein, typically "upper" surfaces will be subjected to a greater flux of deposited material in a deposition chamber than "lower" surfaces.

Following common wisdom, conventional shield designs employed a rounded convex tip having a relatively large radius of curvature and a relatively large thickness at the tip. For example, thickness at the tip of greater than 0.2 inches, and a radius of curvature of greater than 0.1 inches, was employed in a conventional design. The underlying belief for using this design stemmed from the common notion that high curvature (and small curvature radius) is detrimental to integrity of deposited films (e.g., as described in "Delamination of compressed films on curved substrates", Hutchinson, J. W., J. Mech. Phys. Sol., 49 (2001) 1864-1874). It was generally believed that films deposited on sharp or highly curved edges will flake more readily than films deposited on smooth surfaces with little curvature.

However, contrary to common wisdom, it was discovered that flaking and delamination are significantly less pronounced on highly curved tips, characterized by a very small radius of curvature. Further, it was herein recognized that decreasing the thickness of the shield at the tip similarly leads to decreased flaking. Accordingly, in some embodiments, the shield has a thickness at the tip of less than about 0.2 inches, less than about 0.1 inches, less than about 0.05 inches, and even less than about 0.02 inches. For example, the shields having thicknesses at the tip of about 0.08 inches, 0.04 inches and 0.01 inches all exhibited improved performance as compared to the conventional shield having a thickness at the tip of about 0.2 inches. While the invention is not bound by a particular theory, it is believed that the described shield design characterized by a thin tip, leads to reduction of convex surface area at the tip, leading to smaller amount of stressed material on convex surface and thereby provides better results, even if curvature itself at the tip edge is high.

Drawings 2A-2D are used to illustrate this concept. According to some embodiments, the shield has a rounded tip having a generally arc-like shape (as seen in cross-section), formed at the terminus of the edge portion of the shield, where the thickness of the edge at the tip is very small. The thickness at the tip, as used herein, refers to the distance between the upper and lower edge surfaces at the points of the arc connection to the upper and lower surfaces. This is illustrated, for example, in FIG. 2A, which shows a cross-sectional view of a shield edge portion 209. The edge portion 209 has an upper edge surface 203 and a lower edge surface 213 which curve at points 217 and 218 forming an arc connecting the upper and lower surfaces of the edge portion, such that a rounded tip is formed. Points 217 and 218 will be referred to as points of arc connection to the upper or lower surfaces or as points of arc origin.

The thickness at the tip is $h_1$, which is equal to a distance between upper and lower surfaces at the points of arc origin 217 and 218. The thickness (or the distance between upper and lower edge surfaces at the tip) is determined, in a more general case by providing a plane that is tangent to one of the edge surfaces at the first point of arc origin, providing a parallel plane through a second point of arc origin, and determining a distance between these two parallel planes. For example, in FIG. 2A, the surface 213 is not curved and the plane tangent to this surface at point of arc origin 218 coincides with surface 213. A parallel plane is then provided at the second point of arc origin 217. The thickness at the tip is measured as the distance between these two parallel planes.

As it was mentioned, it is preferred that $h_1$ is small, e.g., less than about 0.2 inches, less than about 0.1 inches, less than about 0.05 inches, and even less than about 0.02 inches. The radius of the arc curvature is R, and the central angle for the arc in this case is 180°. In this example, the edge portion 209 is tapered with the upper edge surface 203 not being parallel to lower edge surface 213. In general, upper and lower edge surfaces may have a variety of shapes, which may be the same or different, and may be curved, flat, parallel or non-parallel. It is, however, preferred, in some embodiments, that the upper edge surface smoothly transitions into the curved tip, preferably such that convex area at the upper portion of the tip is minimized.

Figure 2A:
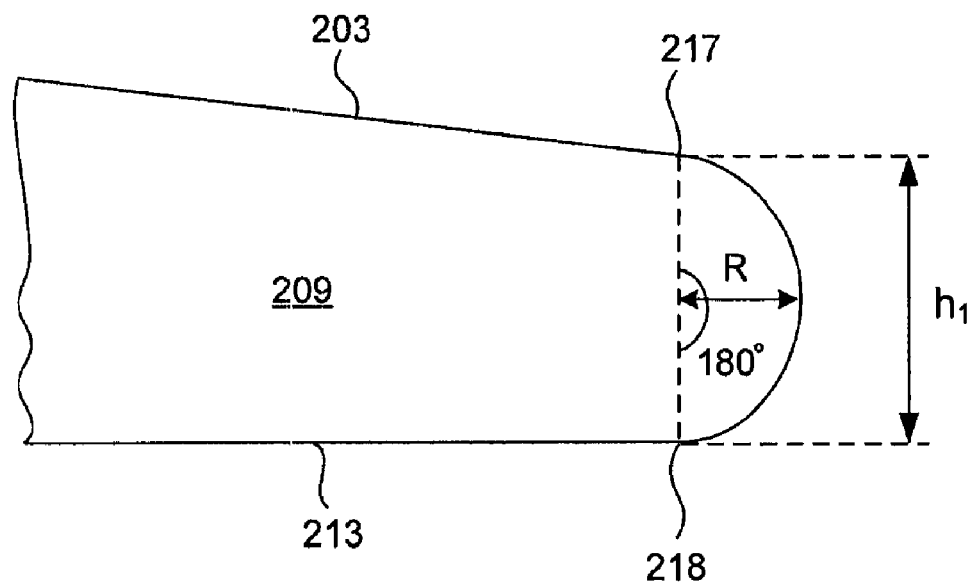
FIG. 2A is a side cross-sectional view of an outer portion of a shield in accordance with an embodiment of an invention. A thin tip with small curvature radius is illustrated.

In the embodiment illustrated in FIG. 2A the arc corresponds to a central angle of 180°, and the distance between the points of arc origin is equal to the diameter of the curvature. Therefore, in these embodiments the radius of the curvature is less than about 0.1 inches, less than about 0.5 inches, less than about 0.025 inches, and even less than about 0.01 inches.

Figure 2B:
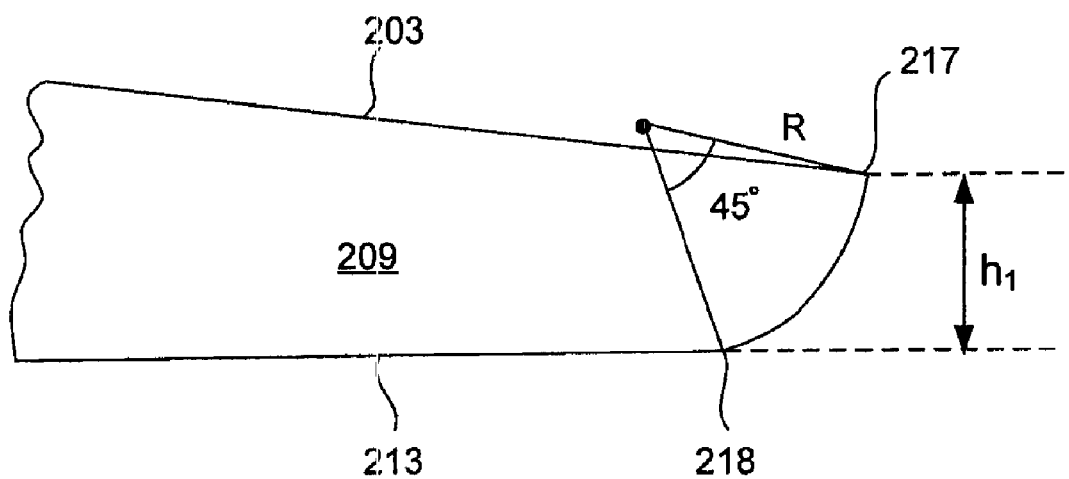
FIG. 2B is a side cross-sectional view of an outer portion of a shield in accordance with an embodiment of an invention. A thin tip is illustrated.

However, in other embodiments, the arc at the rounded tip may correspond to a smaller central angle, e.g., to an angle of between about 10-120°. This is illustrated, by a shield edge profile shown in FIG. 2B. In this design, the central angle for a tip arc is about 45° while, as in the previous embodiment the thickness at the edge, $h_1$, is very small and may have values mentioned above. In those cases where the tip arc angle is less than about 180°, the actual radius of tip curvature may vary rather widely, and may be even equal or greater than the thickness at the tip h1.

In some embodiments, rounded tips with a central angle of at least about 90° are used. In other embodiments, a pointed tip with little or no rounding may be employed. It is understood that in those cases where the tip has a generally arc-like shape in cross-section, the shape does not necessarily need to be a perfectly curved arc. For example, tips with one or more curved and flat portion, which in general produce an arc-like appearance are well within the scope of presented embodiment.

Figure 2C:
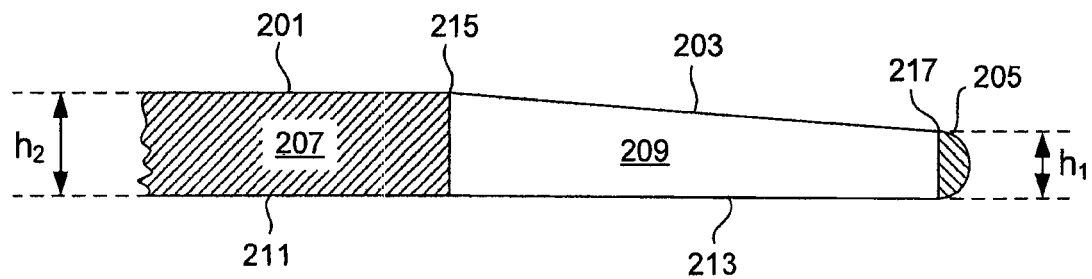
FIG. 2C is a side cross-sectional view of an outer portion of a shield in accordance with an embodiment of an invention. A rounded tip having a small tip radius is illustrated

An illustration of a shield portion in accordance with one embodiment of the invention is shown in FIG. 2C. The shield has a main portion 207 designed or adapted to mount the shield on to an element of a deposition chamber. The main portion 207 continues on to the edge portion 209 which terminates in space with a rounded thin tip 205. The main portion 207 is defined by an upper main surface 201 and a lower main surface 211 which connect to an upper edge surface 203 and a lower edge surface 213 respectively. The rounded tip 205 connects the upper edge surface 203 with a lower edge surface 213 by an arc-like shape (as seen in cross-section). In the described embodiment, the tip 205 has an arc-like shape in cross-section, corresponding to a central angle of 180°. The distance between the points of arc origin $h_1$ in this embodiment is equal to the diameter of tip curvature. The distance between the points of arc origin in this embodiment is equal to the distance between the upper edge surface 203 and the lower edge surface 213 at the origin of the curving, 217. The distance $h_1$, according to various embodiments, is less than about 0.2 inches, less than about 0.05 inches, and even less than about 0.02 inches, where the radius of the curvature corresponds to ½ of these values.

In addition to a very small radius of curvature at the tip, the shield portion depicted in FIG. 2C is tapered at the edge. Thus, while the lower surfaces 211 and 213 are straight and connect at a 180° angle, the upper edge surface 203 forms a less than 180° angle with the upper main surface 201, such that the thickness of the edge portion at the tip, $h_1$ is less than the thickness of the main portion 207, $h_2$. In one example, $h_1$ ranges from about 0.005 inches to about 0.15 inches while $h_2$ is greater than $h_1$ and ranges from about 0.05 to about 1 inches. In many embodiments, the average thickness of the main portion of the shield is greater than the average thickness of the edge portion of the shield. The edge portion of the shield, as used herein, corresponds to a distal portion of the shield (with respect to main shield portion adapted for mounting to a chamber element), which has a different geometric property than the adjacent main portion. For example, with respect to FIG. 2C, edge portion begins at point 215, where tapering begins. Typically, the edge portion of the shield is within about 1 inch from the shield tip.

The shield tips described above may be used in conjunction with a variety of shield shapes. For example the shields may include concave main portions, convex main portions, non-curved main portions, and their combinations (as seen in cross-section). It is understood that the shield shape in general follows the contour of deposition chamber or wafer pedestal. Therefore, in many implementations, the shields have generally hollow cylindrical shapes, with their edge portions being generally circumferentially (or otherwise perimetrically) shaped to follow the desired perimeter, which is often circular in cylindrically shaped deposition chambers. It is understood that other perimetric shapes, such as generally rectangular and hexagonal may be also employed. The walls of a generally cylindrical shield may be straight vertical, or may be curved in a variety of ways. Examples of different shield shapes, which can be used in conjunction with the tips described above are described in the commonly assigned application U.S. Ser. No. 10/823,355 filed on Apr. 12, 2004, titled "MOVING INTERLEAVED SPUTTER CHAMBER SHIELDS" naming Martinson et al. as inventors, which is herein incorporated by reference in its entirety and for all purposes. Thus, for example, the shield portion shown in FIG. 2A may be connected with a straight portion, a concave portion, a convex portion, an S-shaped portion, and a variety of combinations for these portions. The shield portion shown in FIG. 2A may have a variety of orientations within the deposition chamber.

Figure 2D:
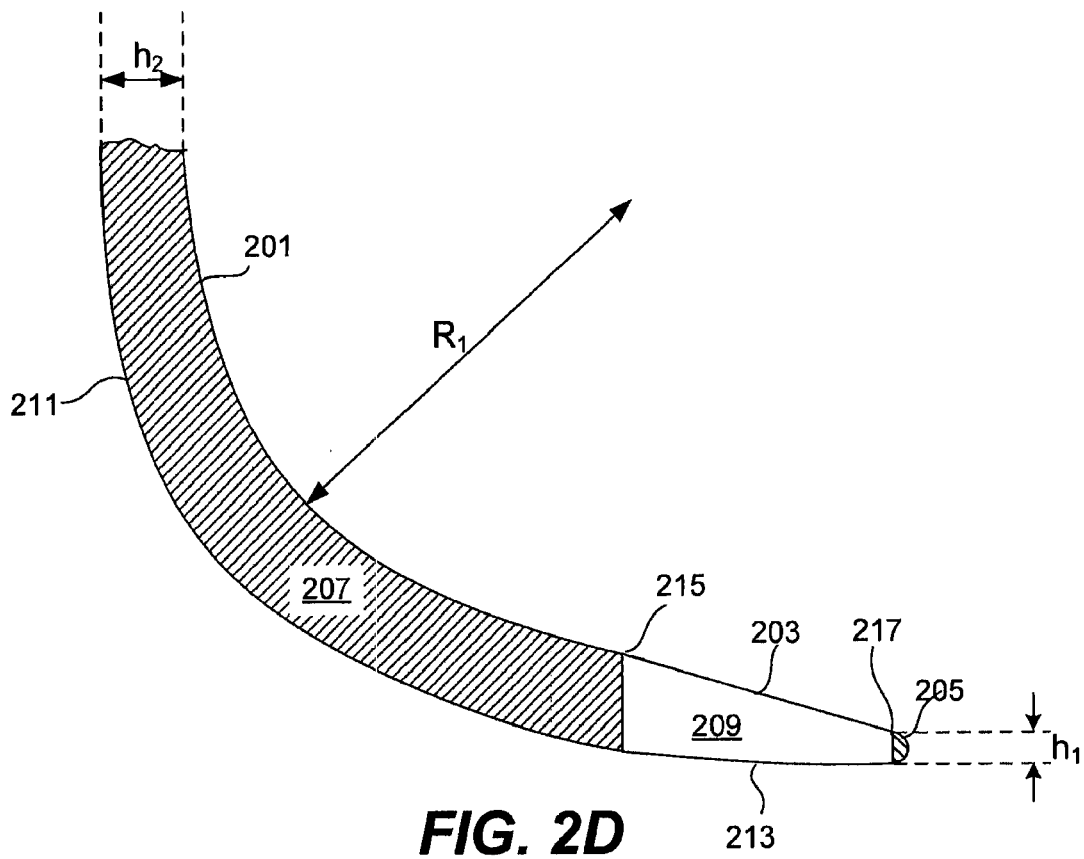
FIG. 2D is a side cross-sectional view of an outer portion of a shield in accordance with an embodiment of an invention. A concave shield portion connecting with a flattened edge portion, which terminates with a rounded tip having a small tip radius is illustrated.

A profiled edge design used in conjunction with a concave shield, is shown in FIG. 2D. In this embodiment, the main portion of the shield includes a concave portion 207, a tapered edge portion 209 terminating in a small rounded tip 205, where the tip has an arc-like shape in cross-section and has dimensions similar to those described above with reference to FIG. 2C. Other similarly numbered components of the shield can have similar dimensions to those described with reference to FIG. 2C. The concave region 207 is characterized by a radius of curvature $R_1$ which may generally range widely from about 0.1 to about 10 inches. For some concave shield embodiments, such as those shown in FIG. 1, the radius of curvature $R_1$ ranges from about 2 to about 3 inches. The embodiment illustrated in FIG. 2D will be described in more detail below, as it also illustrates another aspect of the invention.

Shield Edge Connected to a Concave Surface

In another aspect, an improved edge profile for a shield containing a concave portion includes a tangent plane connecting with an upper (inner) concave surface of the concave portion of the shield, and forming the edge portion of the shield. The tangent plane terminates in space with a tip, which may have the same profile as described in the previous section or a different profile. The edge portion, according to this aspect, extends from the tip to the tangent point with the concave curve (referring to a cross section).

FIG. 2D illustrates one example of a shield profile which includes a concave portion 207 and an edge portion 209, where the upper (inner) surface 201 of the concave portion 207 smoothly connects with the upper edge surface 203, such that the upper edge 203 forms a tangent line (or a tangent plane, if referred to a three-dimensional structure) to the concave upper surface 201 at a tangent point 215. In the depicted example, the bottom (outer) surface 211 of the concave portion 207 and the bottom (outer) edge surface 213, form one arc-like curve. It is understood, however, that the bottom (outer) surfaces 211 and 213 may have a variety of shapes, as long as these designs do not interfere with the profile of the inner surface.

It was discovered that a shield having a concave portion with a flattened edge, where the flattened edge has an upper (inner) tangent plane connecting to the curved inner concave surface, can have a significantly greater lifetime in a deposition chamber, as compared to a shield having a uniformly curved concave upper (inner) edge surface. The described profile was found to delay delamination and flaking of deposited films, particularly of compressively stressed films.

The length of the tangent plane 203 from the interface with the rounding at the tip, 217, to the interface with the upper (inner) concave surface 201 (tangent point 215), can range widely depending on a particular shield design. In some embodiments, the length of the tangent is between about 0.1 and 5 inches, e.g., between about 0.5 and 1.5 inches. In these embodiments, the edge portion of the shield starts at the tangent point, that is, at the point where the geometrical property of the concave curved region of the main shield portion changes from curved to flattened.

In one specific example, the shield has a concave portion 207 having a uniform thickness $h_2$ of about 0.2 inches, and an inner curvature radius $R_1$ of about 2.5 inches. The concave portion 207 connects with a flattened tapered edge portion 209 formed by a flat upper (inner) plane 203 tangent to upper (inner) concave surface 201, and a lower curved concave edge surface 213 connecting with surface 211. The edge portion terminates with a rounded tip 205, which ends with an arc-like shape. The distance between the upper and lower edge surfaces at the origin if the arc, $h_1$ is about 0.1 inches which is about half of $h_2$. The radius of curvature at the tip is about 0.05 inches. The length of the tangent plane 203 from the interface with the tip 217 and the interface with the concave upper surface 201 is about 1 inch.

Figure 3A:
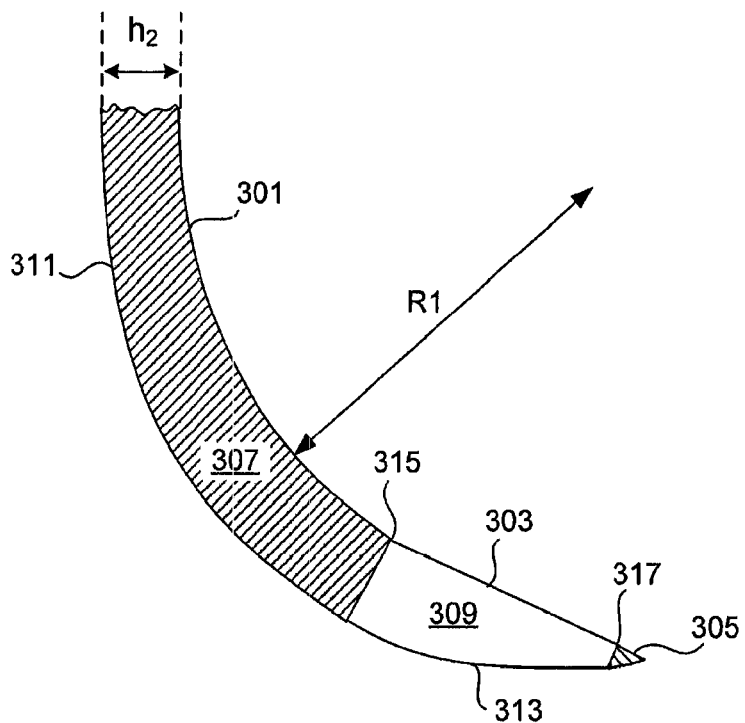
FIG. 3A is a side cross-sectional view of an outer portion of a shield in accordance with an embodiment of an invention. A concave shield portion connecting with a flattened edge portion, which terminates with a partially rounded tip is illustrated.

FIG. 3A illustrates another embodiment of a shield having a concave portion connecting with a flattened edge portion, where an upper (inner) surface of an edge portion forms a tangent plane to an upper (inner) surface of the concave portion. This shield design is similar to the design shown in FIG. 2D, with like elements being numbered similarly. The design illustrated in FIG. 3A is different from the design illustrated in FIG. 2D in that it has a pointed rather than rounded tip 305. In the design illustrated in FIG. 3A the tip is formed by an intersection of the tangent plane 303 and a curved concave bottom (outer) edge surface 313.

Figure 3B:
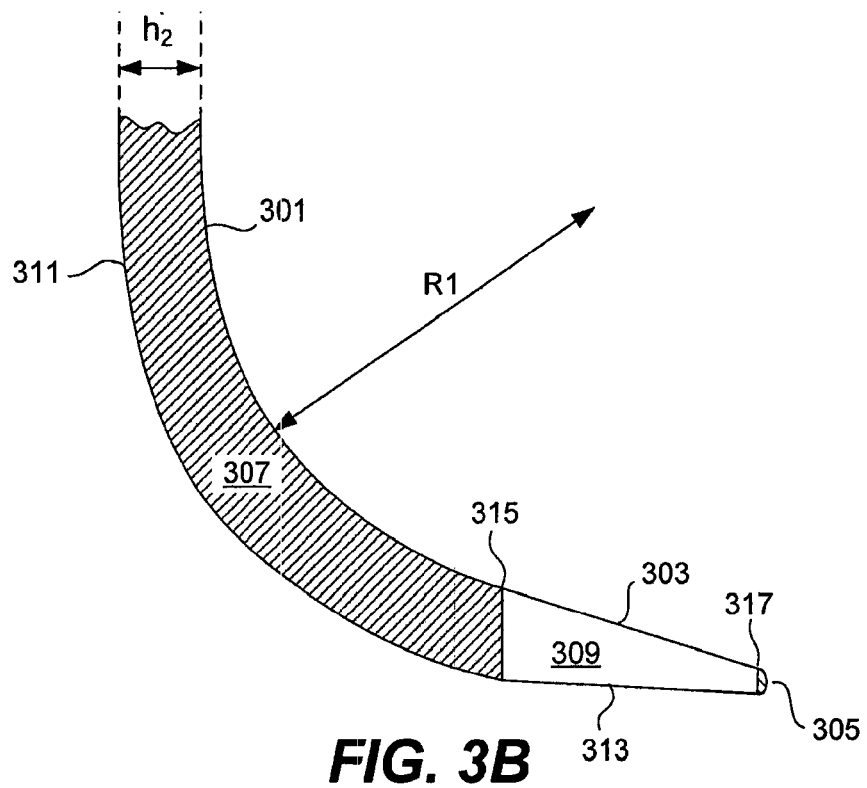
FIG. 3B is a side cross-sectional view of an outer portion of a shield in accordance with an embodiment of an invention. A concave shield portion connecting with a flattened edge portion, which terminates with a rounded tip is illustrated.

Another embodiment of this aspect of the invention is illustrated in FIG. 3B, which is different from the embodiments illustrated by FIGS. 2D and 3A in that the bottom (outer) surface 313 of the edge portion 319 is not curved. As it was mentioned, the bottom (outer) surfaces of the concave portion and of the edge portion can have a variety of shapes, if these shapes are not geometrically inconsistent with the described profile of the upper (inner) surfaces. The shield edge illustrated in FIG. 3B terminates in a rounded tip 305 having a small curvature radius. In other embodiments, other tip designs may be used.

Shield Edge Thickness

In a separate aspect, a shield having a thin edge is provided. Even regardless of a particular shape at the edge of the shield, reduced thickness of the shield at the edge portion is beneficial for accommodating stress of deposited films. Improved stress accommodation at thin edges is attributed to the fact that shield material (typically, metal) is more compliant at a thin edge as compared to a thicker edge. Improved accommodation of stress due to greater compliance of shield material results in reduced flaking of deposited films, and, consequently, in increased lifetime of the shield.

In some embodiments, thickness of the shield at the edge portion (e.g., within about one inch from the tip) does not exceed about 0.2 inches, about 0.1 inches, and even 0.01 inches. In some embodiments, the edge portion of the shield is tapered, with the thickness of the shield gradually decreasing from the interface of the edge portion with the main portion of the shield to the tip of the shield.

In some embodiments, the average thickness of the edge portion is less than the average thickness of the main portion of the shield, e.g., the average thickness of the shield edge portion may be less than about 80%, e.g., less than about 60%, or less than about 50%.

FIGS. 2C, 2D, 3A and 3B all illustrate shields with tapered thin edge portions in combination with shield elements in accordance with other aspects of the invention.

Figure 4A:
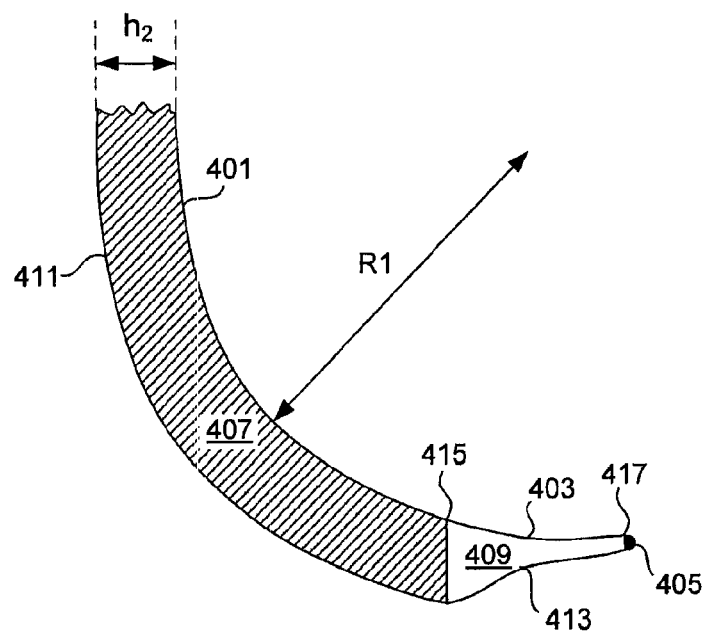
FIG. 4A is a side cross-sectional view of an outer portion of a shield in accordance with an embodiment of an invention. A concave shield portion connecting with a tapered thinner edge portion, which terminates with a rounded tip, is illustrated.
Figure 4B:
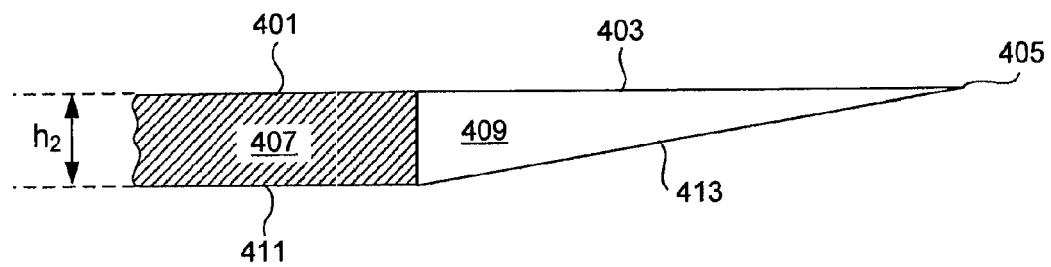
FIG. 4B is a side cross-sectional view of an outer portion of a shield in accordance with an embodiment of an invention. A tapered edge portion terminating in a pointed tip is illustrated.

FIGS. 4A and 4B illustrate shield portions having tapered thin edges in accordance with other embodiments of the invention. In FIG. 4A, for example, a shield having a concave portion 407 connected with an edge portion 409, which terminates in a small rounded tip 405, is illustrated. In this embodiment, however, the upper (inner) edge surface 403 does not form a tangent plane to the upper (inner) concave surface 403, but instead continues the concave surface. Instead, in this embodiment, the edge portion 409 is profiled, by curving the lower (outer) edge surface 413 upward, such that a thinned tapered shield edge is formed.

FIG. 4B illustrates another example of modifying lower edge surface to achieve a thin tapered edge. In this embodiment, the shield portion 407 connected with the edge portion 409 is not curved. The upper surfaces 401 and 403 form one plane, while the lower edge surface 409 forms less than 180° angle with the lower surface 411, resulting in tapering of the edge portion 409, which, in this example, terminates with a pointy tip 409.

Use of shields in the deposition processes

Each of the aspects of edge profiling described above may be used alone or in combination with other aspects. For example, improved tip profiling may be used on a variety of shields, regardless of the shield shapes, as long as the shields have a free tip terminating within the interior space of a deposition chamber. The precise orientation of the shield in the chamber can vary depending on the purpose of the shield, such that the tip may point upward, downward, sideways or at various angles when located within the deposition chamber.

Similarly, the design employing a tangent plane connected with a concave portion of the shield may be used alone or in combination with other aspects (tip profiling and edge thickness profiling) as described above, on a variety of shields which have a concave portion adjacent to the edge of the shield. "Concave" herein refers to concavity with respect to the main flux of particles deposited onto the shield.

Further, the design involving thin shield edges (and/or edges that are thinner than the main portion) may be used alone or in combination with the two aspects described above. Thus, for example, shields having thin edges with sharp or rounded tips may be employed. For shields having concave portions, a thin edge will connect to the concave portion, with or without making use of a tangent plane design described above.

In many deposition systems, the lifetime of a shield is measured as a kit life, which quantifies the time that the shield may be in use while taking into account power supplied to the deposition chamber (e.g., power supplied to a metal target in a PVD chamber). The kit life is measured in kW·hours, and refers to shield life until failure occurs, where the failure is defined as release of contamination typically in the form of particles or flakes or delaminated material.

Shields having profiled edges as described above can exhibit a kit life of at least about 2,000 kWh, and generally exhibit better performance than conventional shields.

Significantly, the described shields can be used during deposition of highly compressively stressed films, such as metal or metal nitride films or their combinations, since these shields are well suited for accommodation of compressively stressed materials. For example, the shields can exhibit a kit life of 2,000 kWh and greater for PVD deposition of metal nitride materials. It is understood that the use of described shields is not limited to processes involving deposition of compressively stressed materials, and that these processes serve merely as an illustration of the many applications of the described shields have in various vacuum process chambers.

Although various details have been omitted for clarity's sake, various design alternatives may be implemented. For example, the shields designs described above may be optimized for a particular material being deposited, as will be understood by those of skill in the art. Further, the surface of the described shields may be roughened and/or textured to improve adhesion of deposited films to the shield. For instance, grit-blast and/or arc-sprayed surfaces may be employed.

Accordingly, the present examples are to be considered as illustrative and not restrictive, and the invention is not to be limited to the details given herein, but may be modified within the scope of the appended claims.

What is claimed is:

1. A shield configured for protecting components of a vacuum process chamber from undesired deposition of a material, the shield comprising:
 a main portion designed or adapted to connect to an element of the vacuum process chamber, the main portion comprising an upper main surface and a lower main surface, wherein the main portion has a first average thickness;

a generally perimetrically shaped edge portion connected with the main portion, wherein the edge portion has an upper edge surface connected with the upper main surface and a lower edge surface connected with the lower main surface, wherein the edge portion has a second average thickness;

and a tip portion forming the terminus of the edge portion within an interior space of the chamber, and connecting the upper edge surface and a lower edge surface, wherein the tip portion has a rounded profile, such that an arc-like shape connects the upper edge surface and the lower edge surface, and wherein the distance between the upper edge surface and the lower edge surface at the tip is less than the first average thickness, wherein at least a part of the main portion of the shield has a generally concave shape, comprising a concave upper surface, and wherein the upper surface of the edge portion of the shield forms a tangent plane to the concave upper surface of the main portion of the shield.

2. The shield of claim 1, wherein the distance between the upper edge surface and the lower edge surface at the tip is less than about 0.1 inches.

3. The shield of claim 1, wherein the distance between the upper edge surface and the lower edge surface at the tip is less than about 0.05 inches.

4. The shield of claim 1, wherein the distance between the upper edge surface and the lower edge surface at the tip is less than about 0.02 inches.

5. The shield of claim 1, wherein the first average thickness is greater than the second average thickness.

6. The shield of claim 5, wherein the edge portion of the shield is tapered, such that thickness of the edge portion of the shield decreases from the interface with the main portion of the shield towards the tip.

7. The shield of claim 5, wherein the first average thickness is at least about 0.2 inches.

8. The shield of claim 1, wherein the radius of concave main portion of the shield is between about 0.1 and 10 inches.

9. The shield of claim 1, wherein the length of the tangent from the tip to the interface with the concave central portion is between about 0.1 and 5 inches.

10. The shield of claim 1, wherein the shield has a kit life of at least about 2,000 kWh.

11. The shield of claim 1, wherein the edge portion of the shield has a variable thickness.

12. The shield of claim 1, wherein the tip has a radius of curvature that is equal to half of the distance between the upper edge surface and the lower edge surface at the tip.

13. The shield of claim 1, wherein the shield is adapted to be movable within the vacuum process chamber.

14. The shield of claim 1, wherein the shield comprises a shutter.

15. A vacuum process chamber comprising the shield of claim 1.

16. The vacuum process chamber of claim 15, wherein the vacuum process chamber is a physical vapor deposition (PVD) chamber or a chemical vapor deposition (CVD) chamber.

17. A shield configured for protecting components of a vacuum process chamber from undesired deposition of a material, the shield comprising:

a concave portion comprising an upper concave surface and a lower surface, wherein the concave portion of the shield has a first average thickness;

an edge portion connecting with the concave portion, wherein the edge portion has an upper edge surface connecting with the upper concave surface and a lower edge surface connecting with the lower surface of the concave portion, wherein the edge portion has a second average thickness, and wherein the upper surface of the edge portion of the shield forms a tangent plane to the concave upper surface of the concave portion of the shield.

18. The shield of claim 17, wherein the second average thickness is smaller than the first average thickness.

19. The shield of claim 17, wherein the edge portion is tapered such that thickness of the edge portion decreases from an interface with the concave portion of the shield towards a tip at a terminus of the shield edge.

20. The shield of claim 17, wherein both the upper surface and the lower surface of the concave portion are arc-like and concave.

21. The deposition chamber comprising the shield of claim 17.

22. A shield configured for protecting components of a vacuum process chamber from undesired deposition of a material, the shield comprising:

a concave portion comprising an upper concave surface and a lower surface, wherein the concave portion of the shield has a first average thickness;

an edge portion connecting with the concave portion, wherein the edge portion has an upper edge surface and a lower edge surface, wherein the edge portion has a second average thickness; and a tip portion forming the terminus of the edge portion within an interior space of the chamber, and connecting the upper edge surface and the lower edge surface, wherein the tip portion has a rounded profile, such that an arc-like shape connects the upper edge surface and the lower edge surface, and wherein the distance between the upper edge surface and the lower edge surface at the tip is less than about 0.2 inches.

23. The shield of claim 22, wherein at least one of the upper edge surface and a lower edge surface is flat.

24. A method of shielding a vacuum process chamber from undesired deposition of a material during integrated circuit fabrication, the method comprising:

providing a wafer substrate and at least one shield as recited in claim 1, claim 22 or claim 17 into the vacuum process chamber, wherein the shield is connected with a chamber wall or a wafer pedestal; and depositing the material onto the substrate and onto the shield or etching the material from the substrate while depositing the material onto the shield, such that material deposited onto the shield does not flake or does not contaminate the substrate.

25. The method of claim 24, wherein the vacuum process chamber is a PVD or a CVD process chamber.

* * * * *